US007116604B2

(12) United States Patent
Nakagawa

(10) Patent No.: US 7,116,604 B2
(45) Date of Patent: Oct. 3, 2006

(54) SEMICONDUCTOR MEMORY DEVICE AND METHOD FOR SELECTING MULTIPLE WORD LINES IN A SEMICONDUCTOR MEMORY DEVICE

(75) Inventor: Yuji Nakagawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/790,222

(22) Filed: Mar. 2, 2004

(65) Prior Publication Data
US 2004/0165469 A1 Aug. 26, 2004

Related U.S. Application Data

(62) Division of application No. 10/365,504, filed on Feb. 13, 2003, which is a division of application No. 09/994,611, filed on Nov. 28, 2001, now Pat. No. 6,542,431.

(30) Foreign Application Priority Data
Apr. 6, 2001 (JP) .............................. 2001-108746

(51) Int. Cl.
*G11C 8/00* (2006.01)
*G11C 7/00* (2006.01)
*G11C 7/02* (2006.01)
*G11C 7/10* (2006.01)

(52) U.S. Cl. ................. 365/230.03; 365/196; 365/201; 365/207; 365/230.06; 365/189.05

(58) Field of Classification Search ........... 365/230.03, 365/189.04, 189.05, 189.08, 201, 205, 233, 365/207, 230.06, 230.08, 191, 195, 196
See application file for complete search history.

(56) References Cited

U.S. PATENT DOCUMENTS

| 5,559,746 | A | * | 9/1996 | Fukuzo ........................ 365/203 |
| 5,732,029 | A | * | 3/1998 | Lee et al. .................... 365/200 |
| 5,949,724 | A | | 9/1999 | Kang et al. |
| 5,986,964 | A | * | 11/1999 | Ariki et al. ............. 365/230.03 |
| 5,995,429 | A | * | 11/1999 | Kojima et al. .............. 365/201 |
| 5,999,471 | A | | 12/1999 | Choi |
| 6,002,615 | A | * | 12/1999 | Sawada .................. 365/189.01 |
| 6,023,434 | A | | 2/2000 | Shore et al. |
| 6,081,443 | A | * | 6/2000 | Morishita et al. ........... 365/149 |

(Continued)

FOREIGN PATENT DOCUMENTS

EP     0 747 906 A2    12/1996

(Continued)

OTHER PUBLICATIONS

European Search Report, Aug. 13, 2002 for EP 01 310 065.

*Primary Examiner*—Amir Zarabian
*Assistant Examiner*—Ly Duy Pham
(74) *Attorney, Agent, or Firm*—Arent Fox PLLC

(57) ABSTRACT

A semiconductor memory device that reduces the time for conducting a multiple word line selection test and operates stably. The semiconductor memory device includes memory cell blocks, row decoders, sense amps, block control circuits, and sense amp drive circuits. Each block control circuit generates a reset signal. The reset signal is used to select the word lines with the row decoders at timings that differ between the blocks. Each block control circuit provides the reset signal to the associated row decoder. The block control circuit also provides the reset signal to the associated sense amp drive circuit so that the sense amps are inactivated at timings that differ between the blocks.

5 Claims, 14 Drawing Sheets

U.S. PATENT DOCUMENTS

| | | | |
|---|---|---|---|
| 6,088,292 A * | 7/2000 | Takahashi | 365/233 |
| 6,147,926 A * | 11/2000 | Park | 365/233 |
| 6,205,071 B1 * | 3/2001 | Ooishi | 365/207 |
| 6,327,212 B1 | 12/2001 | Ishikawa et al. | 365/226 |
| 6,337,832 B1 | 1/2002 | Ooishi et al. | 365/233 |
| 6,351,423 B1 * | 2/2002 | Ooishi | 365/207 |
| 6,387,191 B1 | 5/2002 | Stone et al. | 148/320 |
| 6,678,193 B1 * | 1/2004 | Kim et al. | 365/189.05 |
| 6,731,540 B1 * | 5/2004 | Lee et al. | 365/185.17 |
| 6,842,392 B1 * | 1/2005 | Mizugaki et al. | 365/222 |
| 2001/0021142 A1 | 9/2001 | Ooishi | |
| 2002/0075746 A1 | 6/2002 | Ooishi | |

FOREIGN PATENT DOCUMENTS

EP        0 884 735 A2    12/1998

\* cited by examiner

SEMICONDUCTOR MEMORY DEVICE AND METHOD FOR SELECTING MULTIPLE WORD LINES IN A SEMICONDUCTOR MEMORY DEVICE

This is a Division of application Ser. No. 10/365,504 filed Feb. 13, 2003, which in turn is a Divisional of application Ser. No. 09/994,611 filed Nov. 28, 2001, now U.S. Pat. No. 6,542,431. The disclusure of the prior application is hereby incorporated by reference herein in its entirety.

BACKGROUND OF THE INVENTION

The present invention relates to a semiconductor memory device, and more particularly, to a method for testing for interference between adjacent cells that reduces time and prevents noise.

An adjacent cell interference test is conducted on semiconductor devices, especially DRAMs. During the adjacent cell interference test, a certain word line remains selected for a predetermined time, and a sense amplifier amplifies the cell information read from a bit line. Then, interference is detected from the cell information stored in a memory cell connected to the adjacent word line.

Due to the increase in the memory capacity of semiconductor memory devices, the number of word lines has increased. This has lengthened the time required to conduct the adjacent cell interference test. To save testing costs, it is required that the testing time be reduced. Therefore, a multiple word line selection test is conducted to simultaneously activate a plurality of word lines. In this test, it is required that the number of simultaneously selected word lines be increased and abnormal functioning caused by noise be prevented.

FIG. 1 is a circuit diagram of a memory cell array and its peripheral circuits in a semiconductor memory device (DRAM) 50. The memory cell array has four memory cell blocks BL0, BL1, BL2, BL3. Sense amp groups 1 and row decoders 2 are adjacent to the blocks BL0–BL3. Each sense amp group 1 includes a plurality of sense amps 8.

The peripheral circuits include sense amp drive circuits 3, block control circuits 4, a timing signal generation circuit 5, a block address buffer 6, and an address buffer 7. The sense amp drive circuits 3 are each associated with one of the sense amp groups 1. The block control circuits 4 are each associated with one of the blocks 0–3.

The sense amp drive circuits 3 and the block control circuits 4 receive a timing signal from the timing signal generation circuit 5. The block control circuits 4 receive a block address signal Bad from an external device via the block address buffer 6.

The block control circuits 4 generate a word line set signal WLst, which activates word lines, and a word line reset signal WLrs, which inactivates word lines. Further, the block control circuits 4 provide the associated row decoders 2 with the set signal WLst and the reset signal WLrs.

Based on the timing signal and the block address signal Bad, the block control circuits 4 generate a block selection signal Bs1 and provide the associated sense amp drive circuits 3 with the block selection signal Bs1. Based on the block selection signal Bs1, the sense amp drive circuits 3 provide the associated sense amp groups 1 with sense amp drive signals PSA, NSA.

The row decoders 2 receive a word line address signal WLad from an external device via the address buffer 7. The row decoders 2 select word lines based on the word line address signal WLad and the word line set signal WLst and terminates the selection of word lines based on the word line reset signal WLrs.

FIG. 2 is a diagram showing the memory cell array and its peripheral circuits in a single memory cell block. The memory cell block includes, for example, 128 word lines WL0–WL127. A plurality of sense amps 8 are connected to bit lines BL, which intersect each of the word lines WL0–WL127.

In response to the block selection signal Bs1 received from the block control circuit 4, the sense amp drive circuit 3 provides each sense amp 8 with the sense amp drive signals PSA, NSA.

The row decoders 2 select word lines in response to the word line address signal WLad and the word line set signal WLst, which are provided in response to the word lines WL0–WL127. Further, in response to the word line reset signal WLrs, the row decoders 2 terminates the selection of word lines.

The block control circuits 4, the sense amp drive circuits 3, and the row decoders 2 will now be discussed with reference to FIG. 3.

Each block control circuit 4 includes a block selection circuit 9, a word line set signal generation circuit 10, and a word line reset signal generation circuit 11. The block selection circuit 9 receives the block address signal Bad at a high level and a block set timing signal Bstt at a high level. The timing signal Bstt is received from the timing signal generation circuit 5. The block selection circuit 9 has a latch circuit 12a and two inverter circuits 13a to generate the block selection signal Bs1 at a high level in response to the block address signal Bad and the high timing signal Bstt.

When the block selection circuit 9 receives a high block reset timing signal Brst from the timing signal generation circuit 5, the latch circuit 12a and the inverter circuits 13a generate the block selection signal Bs1 at a low level.

The word line set signal generation circuit 10 includes a NAND circuit 14a and an inverter circuit 13b. The NAND circuit 14a has a first input terminal, which receives the block selection signal Bs1, and a second input terminal, which receives a word line set timing signal WLstt from the timing signal generation circuit 5. The inverter circuit 13b receives the output signal of the NAND circuit 14a and generates the word line set signal WLst.

When the word line set signal generation circuit 10 receives the block selection signal Bs1 at a high level and the word line set timing signal WLstt at a high level, the word line set signal generation circuit 10 generates the word line set signal WLst at a high level.

The word line reset signal generation circuit 11 includes a NAND circuit 14b and inverter circuits 13c, 13d. The NAND circuit 14b has a first input terminal, which receives the block selection signal Bs1, and a second input terminal, which receives a word line reset timing signal WLrst from the timing signal generation circuit 5 via the inverter circuit 13c. The two inverter circuits 13d receive the output signal of the NAND circuit and generate the word line reset signal WLrs.

When the word line reset signal generation circuit 11 receives the block selection signal Bs1 at a high level and the word line reset timing signal WLrst at a low level, the word line reset signal generation circuit 11 generates the word line reset signal WLrs at a low level. The word line reset signal generation circuit 11 generates the word line reset signal WLrs at a high level when such signals are not received.

The sense amp drive circuit 3 includes a NAND circuit 14c, inverter circuits 13e, 13f, and transistors Tr1–Tr4. The NAND circuit 14c has a first input terminal, which receives the block selection signal Bs1, and a second input terminal, which receives a sense amp timing signal SAt from the timing signal generation circuit 5.

The output signal of the NAND circuit 14c is provided to the gates of the p-channel MOS transistor Tr1 and the n-channel MOS transistors Tr2, Tr3 via the two inverter circuits 13e. The output signal of the inverter circuit 13e is provided to the gate of the n-channel MOS transistor Tr4 via the inverter circuit 13f.

The transistors Tr1–Tr4 are connected in series between power supplies Vcc and Vss. A sense amp drive signal PSA is generated at a node of the transistors Tr1, Tr2. A sense amp drive signal NSA is generated at a node of the transistors Tr3, Tr4. A node of the transistors Tr2, Tr3 is supplied with precharge voltage Vp.

When the NAND circuit 14C receives the block selection signal Bs1 at a high level and the sense amp timing signal SAt at a high level, the transistors Tr1, Tr4 are activated and the transistors Tr2, Tr3 are inactivated. This generates the sense amp drive signal PSA at a voltage that is substantially the same as that of the power supply Vcc and the sense amp drive signal NSA at a voltage that is substantially the same as that of the power supply Vss.

When either the block selection signal Bs1 or the sense amp timing signal SAt goes low, the transistors Tr1, Tr4 are inactivated and the transistors Tr2, Tr3 are activated. This generates the sense amp drive signals PSA, NSA at a voltage that is the same as the precharge voltage Vp.

When the row decoder 2 receives the world line set signal WLst at a high level and the word line address signal WLad at a high level, the row decoder 2 generates a word line selection signal WL at a high level by means of a latch circuit 12b and two inverter circuits 13g. When the row decoder 2 receives the word line reset signal WLrs at a high level, the output terminal of the latch circuit 12b goes low. In this state, the row decoder 2 generates the word line selection signal WL at a low level by means of the inverter circuit 13g.

The operation of the block control circuit 4, the row decoder 2, and the sense amp drive circuit 3 will now be discussed with reference to FIG. 4.

The block set timing signal Bstt is a pulse signal. The block reset timing signal Brst goes low before the first pulse, of the block set timing signal Bstt. Further, the block reset timing signal Brst goes high after the word line reset timing signal WLrst goes high.

If the block set timing signal Bstt goes high when the block selection circuit 9 is provided with the block address signal Bad, which selects one of the blocks BL0–BL3, the block selection signal Bs1 goes high.

When the block selection signal Bs1 goes high and the word line set signal generation circuit 10 is provided with a word line set timing signal WLstt, which is a pulse signal, the word line set signal generation circuit 10 generates the word line set signal WLst, which is a pulse signal.

In the word line reset signal generation circuit 11, the word line reset timing signal WLrst goes low before the first pulse of the word line set timing signal WLstt and goes high when the word line selection signal WL goes low, The word line reset signal WLrs goes high when the word line reset timing signal WLrst goes high.

The sense amp timing signal SAt goes high after a predetermined time from when the word line set timing signal WLstt goes high and goes low after a predetermined time from when the word line reset timing signal WLrst goes high.

If the sense amp timing signal SAt goes high when the sense amp drive circuit 3 receives the block selection signal Bs1 at a high level, the sense amp drive circuit 3 outputs the sense amp drive signals PSA, NSA. When the sense amp timing signal SAt goes low, the sense amp drive signals PSA, NSA shift to the precharge voltage Vp and inactivate the associated sense amps 8.

The word line address signal WLad goes high every predetermined time. Each time the word line address signal WLad goes high, a pulse of the word line set signal WLst is provided to the row decoder 2.

The voltage of the word line WL corresponding to the word line address signal WLad goes high when the word line set signal WLst goes high. The voltage of each word line WL goes low when the word line reset signal WLrs goes high.

A first example of the adjacent cell interference test conducted on the prior art semiconductor memory device 50 will now be discussed with reference to FIG. 5.

Subsequent to a test mode entry command, the semiconductor memory device 50 is provided with an active command every predetermined time. In synchronism with each active command, the semiconductor memory device 50 is provided with the word line address signal WLad and the block address signal Bad. Based on the operation of the block control circuit 4, the row decoder 2 selects a word line and the sense amp drive circuit 3 activates a sense amp.

Referring to FIG. 5, for example, block BL0 is selected. Further, each active command selects every eight word lines in a manner such as WL0, WL8, and WL16.

The sense amp drive signals PSA, NSA simultaneously provide all of the sense amps 8 in block BL0 after a predetermined time from when word line WL0 is selected. A memory cell connected to the selected word line provides the bit lines with cell information. Each sense amp 8 amplifies the cell information. This state is maintained for a predetermined time.

Then, after a predetermined time elapses, the word line reset aiming signal WLrst, which is based on the precharge command, is provided to the word line reset signal generation circuit 11 and the selected word lines are simultaneously inactivated. The sense amp timing signal SAt inactivates the sense amps 8. In this state, it is checked whether the activation of the word line caused interference between adjacent cells.

Subsequently, in response to the active command, every eight word lines in block SL0 are selected sequentially in a manner such as WL1, WL9, and WL17. In this state, the sense amp drive signals PSA, NSA are simultaneously provided to all of the sense amps 8 in block BL0 after a predetermined time from when the sense amp drive signals PSA, NSA select word line WL1. The sense amps 8 amplify the cell information provided to the bit line and maintain the amplified state for a predetermined time.

Such operation is repeated until all of the word lines in the block BL0 are selected. Further, the same operation is performed in blocks BL1–BL3.

In this case, multiple word lines are simultaneously selected. Thus, in comparison to when the word lines are activated one by one, the test time is reduced. However, although multiple word lines are simultaneously selected in each of blocks BL0–BL3 in the first example, word lines of multiple blocks cannot be simultaneously selected. As a result, test time cannot be sufficiently reduced.

A second prior art example of the adjacent cell interference test will now be discussed with reference to FIG. 6. In the second prior art example, multiple word lines of multiple blocks, for example, blocks BL0 and BL2, are simultaneously selected. Further, multiple word lines of blocks BL1 and BL3 are simultaneously selected. This reduces test time.

In synchronism with the first two active commands following the test mode entry command, the semiconductor memory device 50 is sequentially provided with the block address signal Bad, which selects the blocks BL0. BL2. Blocks BL0, BL2 are selected based on the block address signal Bad. The word line address signal WLad first selects the word line WL0 continuously for two times and then selects every eight word lines in a manner such as WL8, WL16.

The first two active commands sequentially activate word lines WL0 of blocks BL0, BL2. Subsequently, every eight word lines of blocks BL0, BL2 are sequentially and simultaneously selected. The sense amps 8 of blocks BL0, BL2 are activated after a predetermined time from the selection of word line WL0 in block BL2. The activated state is maintained for a predetermined time.

Then, the selected word lines are simultaneously inactivated in response to the precharge command. The sense amps 8 are also inactivated.

The operation performed by the block control circuit 4, the sense amp drive circuit 3, and the row decoder 2 to conduct the adjacent cell interference test of FIG. 6 will now be discussed with reference to FIG. 7.

In the operation of FIG. 7, the block address signal Bad is sequentially provided to sequentially select blocks BL0, BL2, and the block set timing signal Bstt sequentially selects blocks BL0, BL2.

The word line address signal WLad, which selects word line WL0, is provided for two cycles so that word line WL0 is selected in blocks BL0, BL2. The other operations, which the blocks undergo, are performed in the same manner as the first example.

In the second example, multiple word lines of multiple blocks are simultaneously selected. This further shortens the test time from that of the first example. However, when the word lines are selected, many sense amps are simultaneously activated in multiple blocks. Further, when selected word lines become no longer selected, many sense amps are simultaneously inactivated. The activation and inactivation of the sense amps produces a switching noise in the power supply. The switching noise may cause the semiconductor memory device 50 to function erroneously.

The timing for activating sense amps is the same in the blocks. However, the timing for starting the selection of word lines differs between the blocks. This results in a shortcoming in that the margin for amplifying the sense amps is not constant. In other words, time t1, which is required to activate the sense amps 8 after word line WL0 is selected in block BL0, is longer than time t2, which is required to activate the sense amps 8 after word line WL0 is selected in block BL2.

Thus, the margin for amplifying the cell information when word line WL0 is activated in block BL0 decreases. This problem occurs because multiple blocks are operated at the same timing.

In other words, in the second prior art example, the block address signal Bad and the word line address signal WLad are provided to simultaneously select multiple word lines in multiple blocks. Further, the sense amps are activated and inactivated at the same timing.

SUMMARY OF THE INVENTION

It is an object of the present invention to provide a semiconductor memory device that reduces the time for conducting a word line multiple selection test and functions stably.

To achieve the above object, the present invention provides a semiconductor memory device including a plurality of memory cell blocks. Each of the memory cell blocks includes a plurality of memory cells and a plurality of word lines connected to the memory cells. A plurality of row decoders are connected to the plurality of memory cell blocks. Each of the row decoders selects one of the word lines in an associated one of the memory cell blocks. A plurality of sense amp groups are connected to the plurality of memory cell blocks. Each of the sense amp groups amplifies cell information read from the plurality of memory cells of an associated one of the memory cell blocks. A plurality of block control circuits connected to the plurality of row decoders. Each of the block control circuits simultaneously selects multiple word lines in an associated one of the memory cell blocks and generates a sense amp control signal. A plurality of sense amp drive circuits are connected to the plurality of block control circuits and the plurality of sense amp groups. Each of the sense amp drive circuits selectively activates an associated one of the sense amp groups based on the sense amp control signal of the associated one of the block control circuits. Each of the block control circuits generates at least one reset signal and provides the reset signal to an associated one of the row decoders and to an associated one of the sense amp drive circuits. The reset signal is provided to the associated one of the row decoders so that the timing for selecting the word lines with the row decoders differs between each block. The reset signal is provided to the associated one of the sense amp drive circuits so that inactivation of the plurality of sense amp groups differs between each block.

A further perspective of the present invention is a method for conducting a multiple word line selection test on a semiconductor memory device provided with a plurality of memory cell blocks, which include a first memory cell block and a second memory cell block. Each of the memory cell blocks has a plurality of memory cells and a plurality of word lines connected to the memory cells. A plurality of sense amp groups are connected to the first and second memory cell blocks. Each of the sense amp groups amplifies cell information read from the plurality of memory cells of an associated one of the memory cell blocks. The method includes a first step for activating one of the plurality of word lines in the first memory cell block and activating the sense amp group associated with the first memory cell block after a predetermined time, a second step for activating word lines other than the one that has been activated in the first memory cell block, a third step for activating one of the plurality of word lines in the second memory cell block and activating the sense amp group associated with the second memory cell block after a predetermined time, and a fourth step for activating word lines other than the one that has been activated in the second memory cell block. The third and fourth steps are performed while the first and second steps are continuously performed or the second and fourth steps are performed while the first and third steps are continuously performed.

A further perspective of the present invention is a method for conducting a multiple word line selection test on a semiconductor memory device provided with a plurality of memory cell blocks, which include a first memory cell block and a second memory cell block. Each of the memory cell blocks have a plurality of memory cells and a plurality of word lines connected to the memory cells. A plurality of sense amp groups are connected to the first and second memory cell blocks. Each of the sense amp groups amplifies cell information read from the plurality of memory cells of an associated one of the memory cell blocks. The method includes a first step for inactivating multiple word lines in the first memory cell block and the sense amp group associated with the first memory cell block, and a second step for inactivating multiple word lines in the second memory cell block and the sense amp group associated with the second memory cell block after performing the first step.

A further perspective of the present invention is a method for conducting a multiple word line selection test on a semiconductor memory device provided with a plurality of memory cell blocks, which include a first memory cell block and a second memory cell block. Each of the memory cell blocks have a plurality of memory cells and a plurality of word lines connected to the memory cells, and a plurality of sense amp groups connected to the first and second memory cell blocks. Each of the sense amp groups amplifies cell information read from the plurality of memory cells of an associated one of the memory cell blocks. The method includes a first step for activating one of the plurality of word lines in the first memory cell block and activating the associated one of the sense amp groups with the first memory cell block after a predetermined time, a second step for activating word lines other than the one that has been activated in the first memory cell block, a third step for activating one of the plurality of word lines in the second memory cell block and activating the sense amp group associated with the second memory cell block after a predetermined time, a fourth step for activating word lines other than the one that has been activated in the second memory cell block, a fifth step for inactivating multiple word lines in the first memory cell block and the sense amp group associated with the first memory cell block, and a sixth step for inactivating multiple word lines in the second memory block and the sense amp group associated with the second memory block after performing the fifth step. The third and fourth steps are performed while the first and second steps are continuously performed or the second and fourth steps are performed while the first and third steps are continuously performed.

A further perspective of the present invention provides a semiconductor memory device including a plurality of memory cell blocks. Each of the memory cell blocks includes a plurality of memory cells and a plurality of word lines connected to the memory cells. A plurality of row decoders are connected to the plurality of memory cell blocks. Each of the row decoders selects one of the word lines in an associated one of the memory cell blocks. A plurality of sense amp groups are connected to the plurality of memory cell blocks. Each of the sense amp groups amplifies cell information read from an associated one of the memory cells. A plurality of block control circuits are connected to the plurality of row decoders. Each of the block control circuits simultaneously selects multiple word lines in an associated one of the memory cell blocks and generates a sense amp control signal. A plurality of sense amp drive circuits are connected to the plurality of block control circuits and the plurality of sense amp groups. Each of the sense amp drive circuits selectively activates an associated one of the sense amp groups based on the sense amp control signal of the associated one of the block control circuits. Each of the sense amp drive circuits includes a latch circuit.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
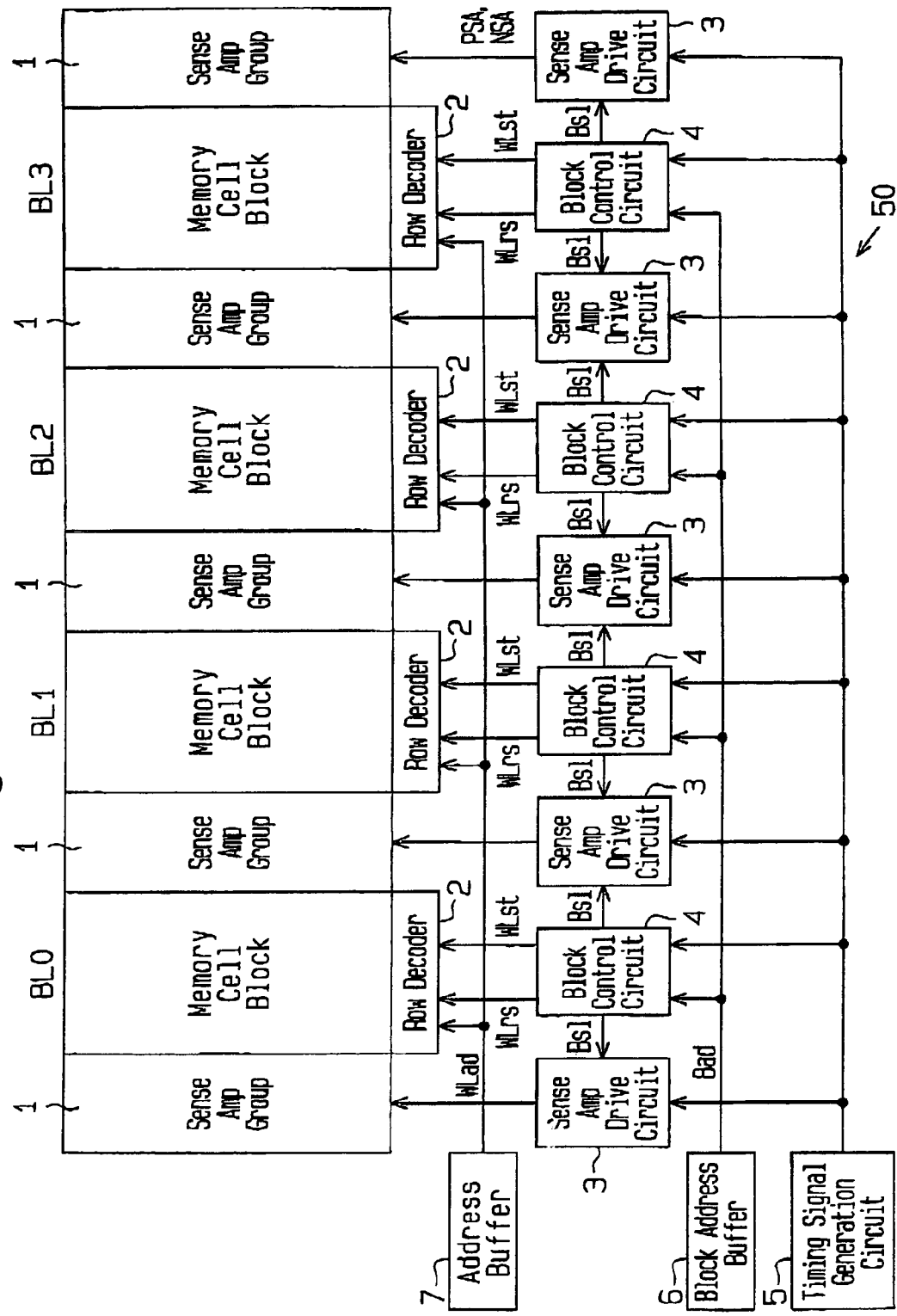
FIG. 1 is a schematic block diagram of a prior art semiconductor memory device having a plurality of memory cell blocks.
Figure 2:
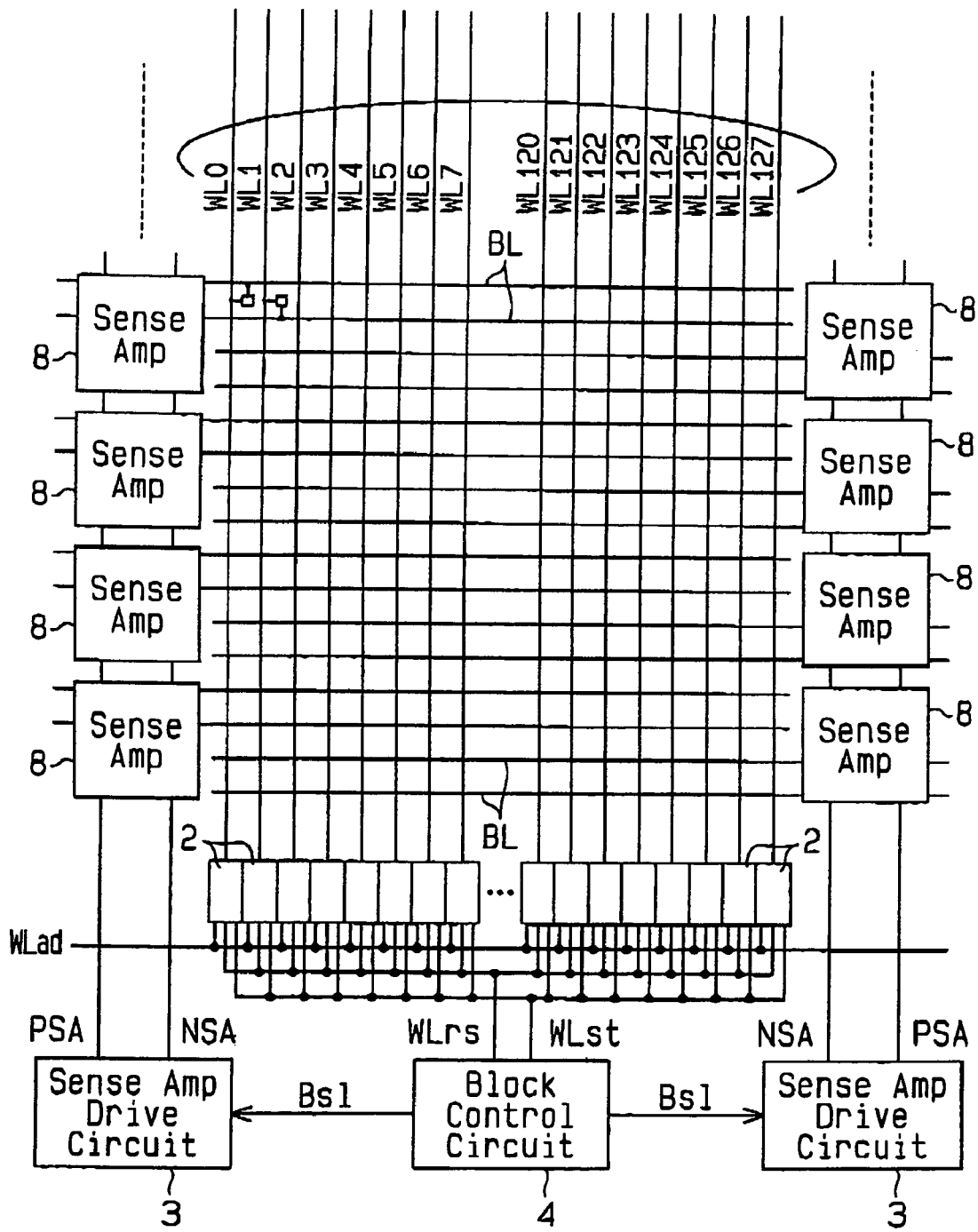
FIG. 2 is a schematic block diagram of one block in the semiconductor memory device of FIG. 1.

In the drawings, like numerals are used for like elements throughout.

First Embodiment

Figure 8:
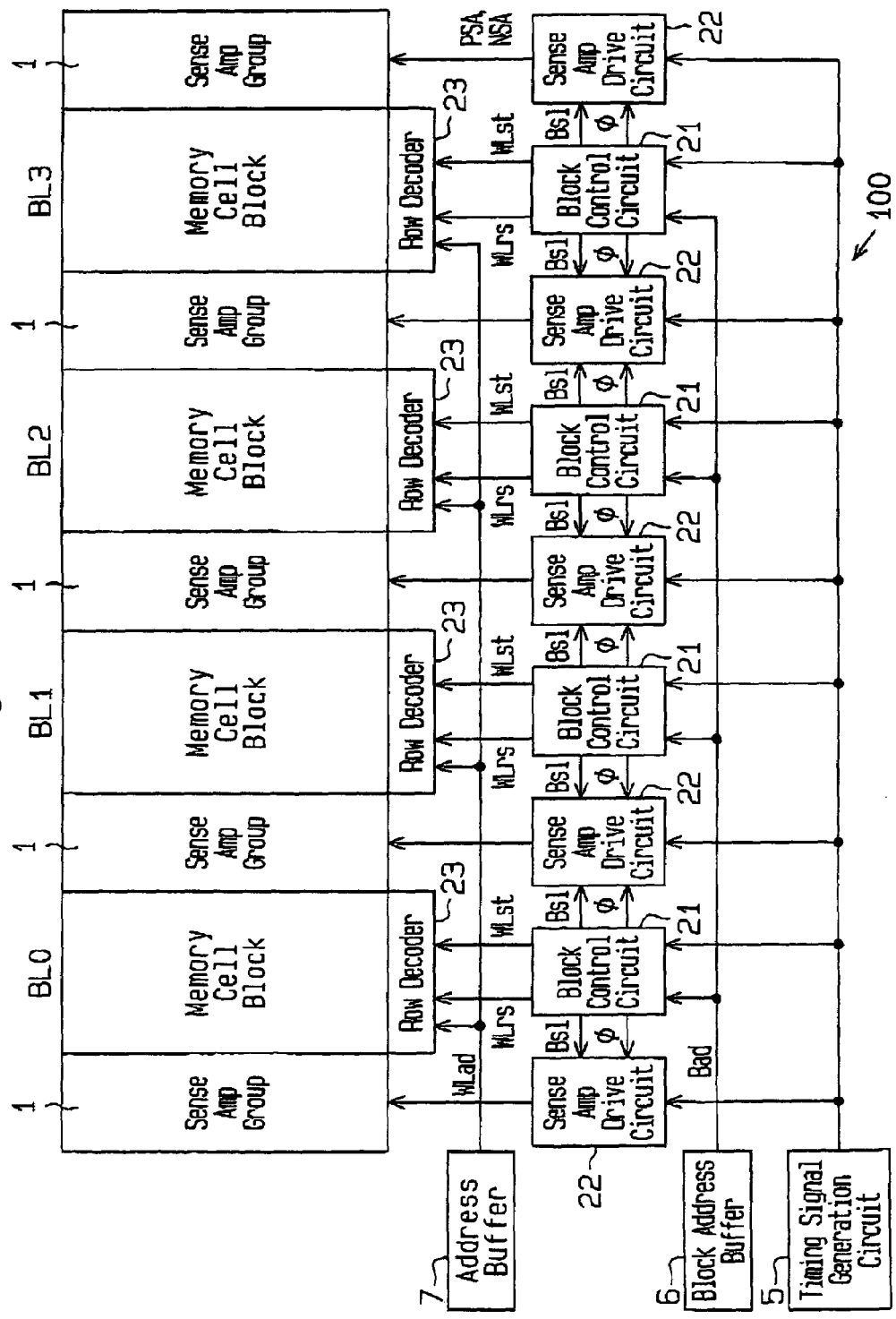
FIG. 8 is a schematic block diagram of a semiconductor memory device according to a first embodiment of the present invention.

FIG. 8 is a schematic block diagram of a semiconductor memory device 100 according to a first embodiment of the present invention. The semiconductor memory device 100 includes four memory cell blocks BL0, BL1, BL2, BL3, a plurality of sense amp groups 1, a plurality of block control circuits 21, a plurality of sense amp drive circuits 22, and a plurality of row decoders 23.

Each of the blocks SL0–BL3 is connected to the associated sense amp groups 1 and row decoder 23.

Each of the row decoders 23 selects word lines in the associated one of the blocks BL0–BL3. Each of the sense amp groups 1 has a plurality of sense amps 8. Each sense amp 8 amplifies cell information read when a word line is selected. Each of the block control circuits 21 has a multiple word line selection function, which simultaneously selects multiple word lines in multiple blocks.

Each of the sense amp drive circuits 22 controls the activation and inactivation of the associated sense amps 8 based on the output signal of the associated block control circuit 21.

Each of the block control circuits 21 provides the associated row decoder 23 with a reset signal WLrs to inactivate word lines at timings differing between blocks. Further, each block control circuit 21 generates a signal Ø (WLrs) to inactivate the associated sense amps 8 at timings differing between blocks and provides the signal Ø to the associated one of the sense amp drive circuits 22.

Figure 9:
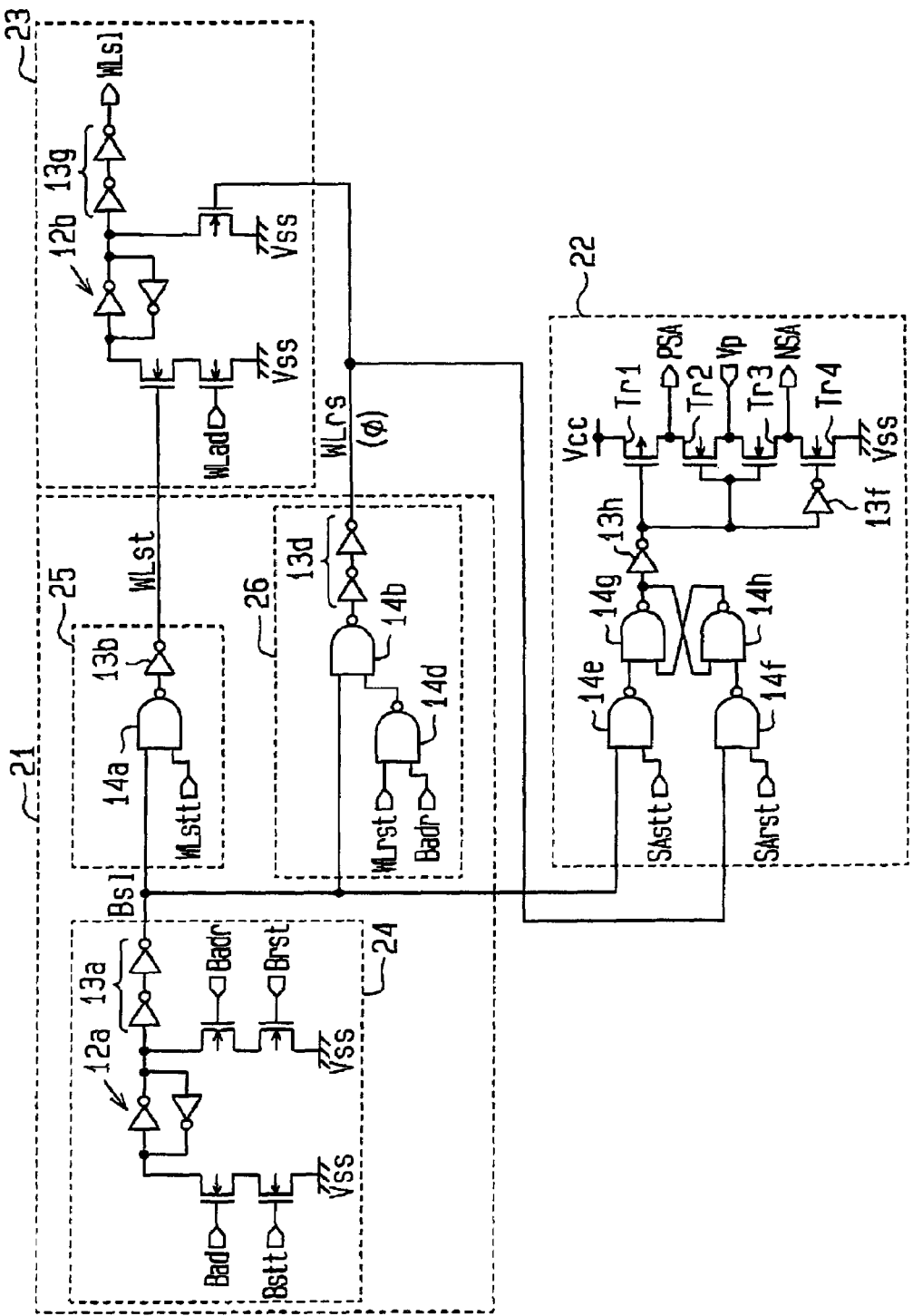
FIG. 9 is a schematic circuit diagram of peripheral circuits of the semiconductor memory device of FIG. 8.

FIG. 9 is a schematic circuit diagram of the block control circuit 21, the sense amp drive circuit 22, and the row decoder 23. Although the block control circuits 21 and the sense amp drive circuits 22 of the semiconductor memory device 100 differ from the block control circuits 4 and the sense amp drive circuits 3, the configuration of the remaining parts of the semiconductor memory device 100 is the same as that of the prior art semiconductor memory device 50.

Each block control circuit 21 includes a block selection circuit 24, a word line set signal generation circuit 25, and a word line reset signal generation circuit 26. The block selection circuit 24 has a reset terminal to receive the block address signal Bad. The remaining parts of the block selection circuit 24 are the same as corresponding parts of the block selection circuit 9.

The block address signal Bad is provided in parallel to the block reset timing signal Brst. Accordingly, when the block selection circuit 24 receives the block address signal Bad at a high level and the block reset timing signal Brst, the block selection circuit 24 generates the block selection signal Bs1 at a low level.

Figure 3:
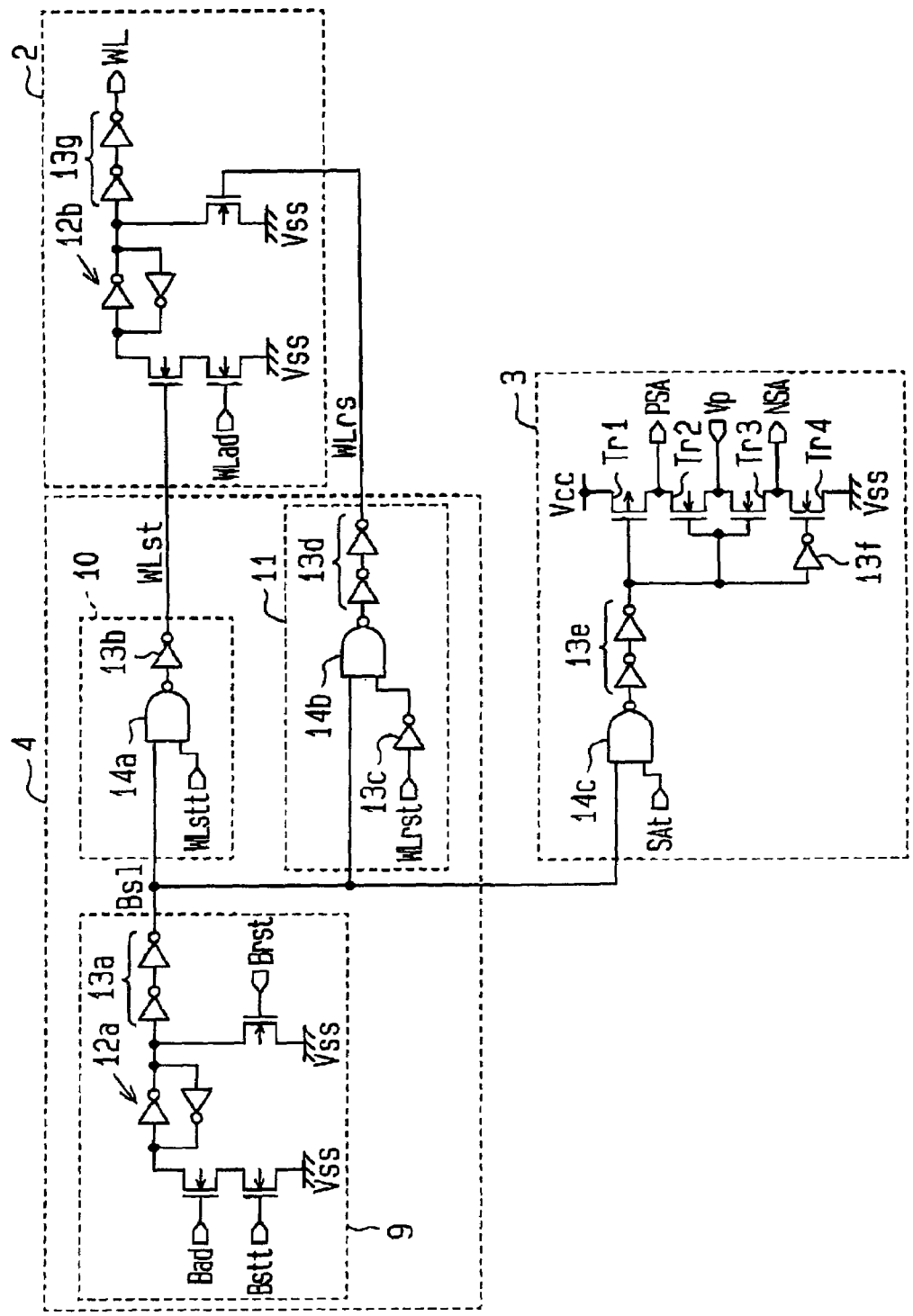
FIG. 3 is a schematic circuit diagram of peripheral circuits in the semiconductor memory device of FIG. 1.
Figure 4:
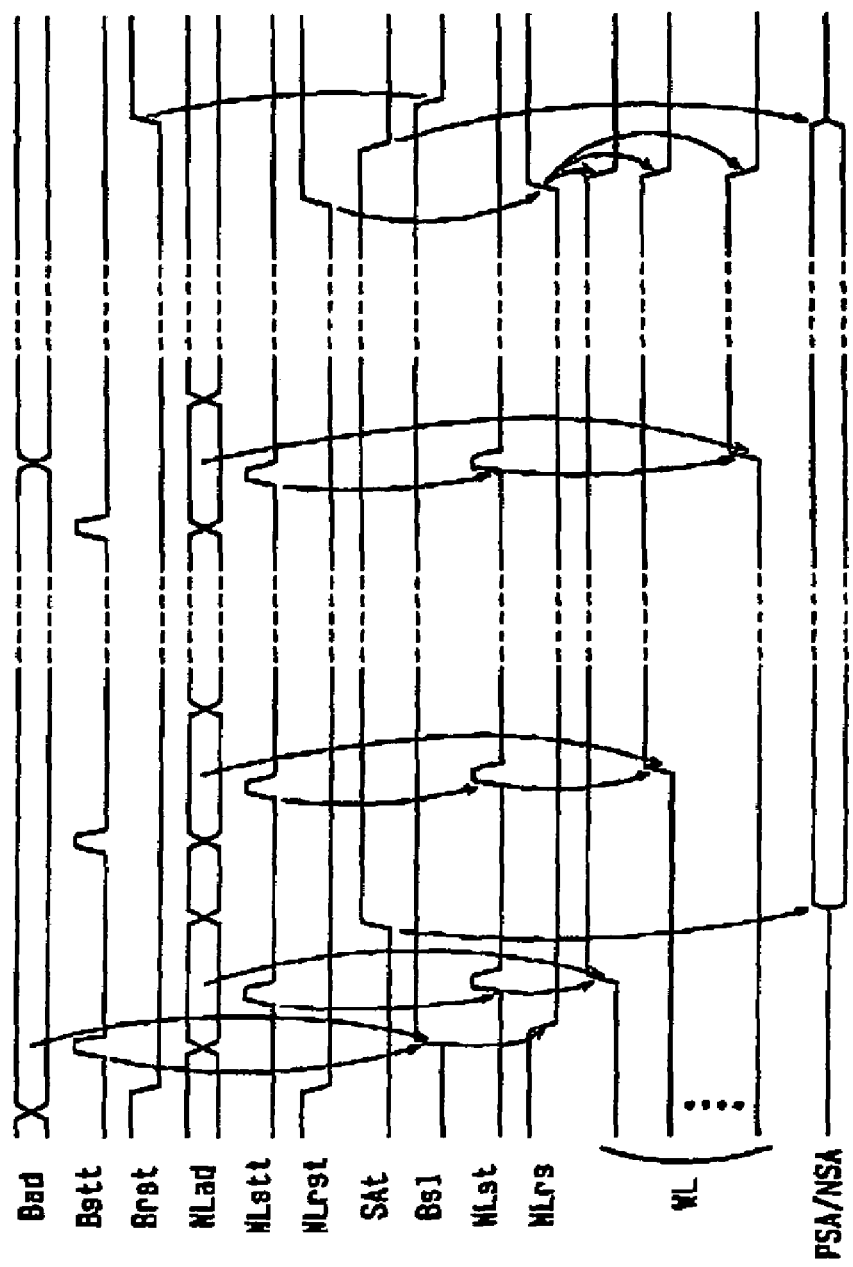
FIG. 4 is a combined timing and waveform chart illustrating the operation performed in a first test example of the semiconductor memory device of FIG. 1.
Figure 5:
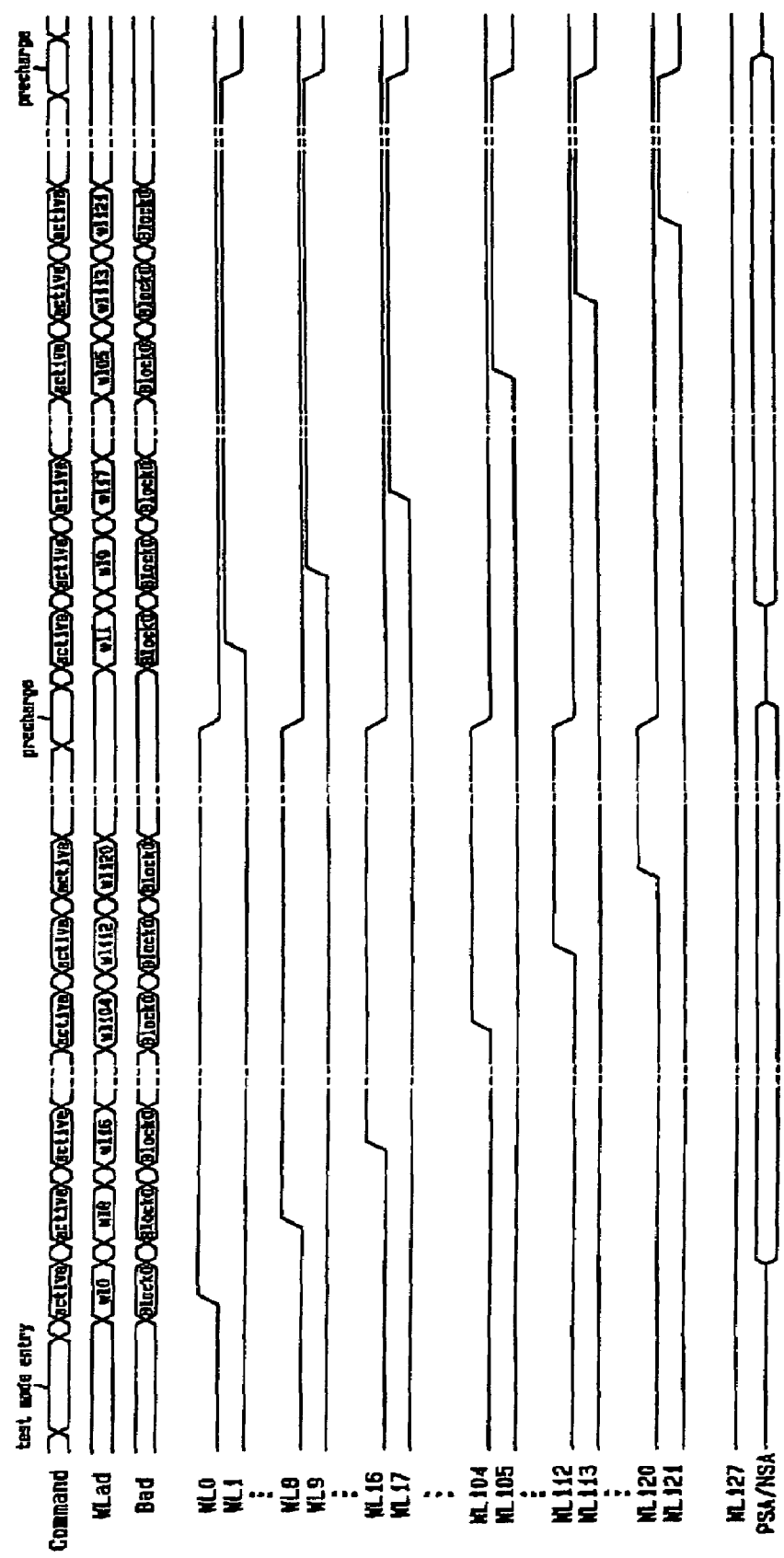
FIG. 5 is a combined timing and waveform chart illustrating the operation performed in the first test example of the semiconductor memory device of FIG. 1.
Figure 6:
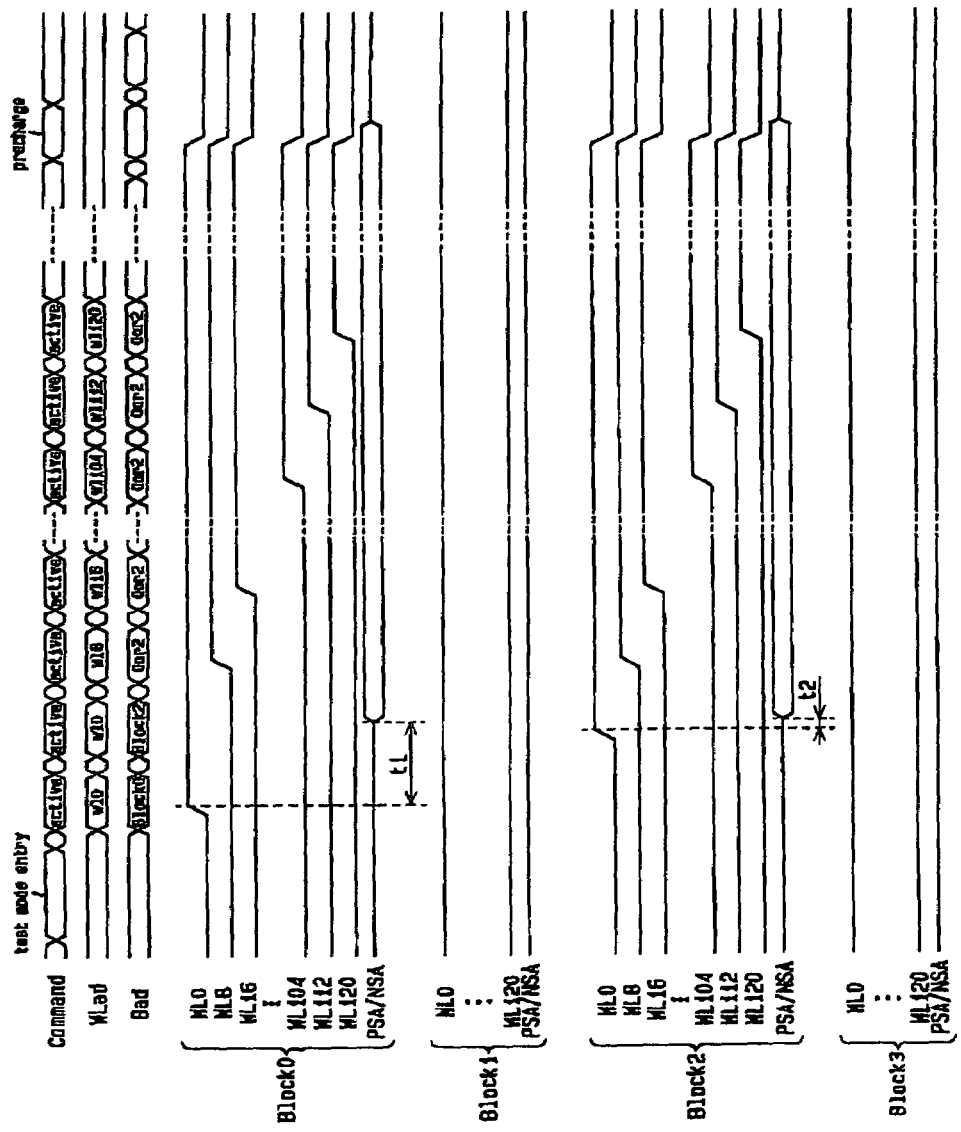
FIG. 6 is a combined timing and waveform chart illustrating the operation performed in a second test example of the semiconductor memory device of FIG. 1.
Figure 7:
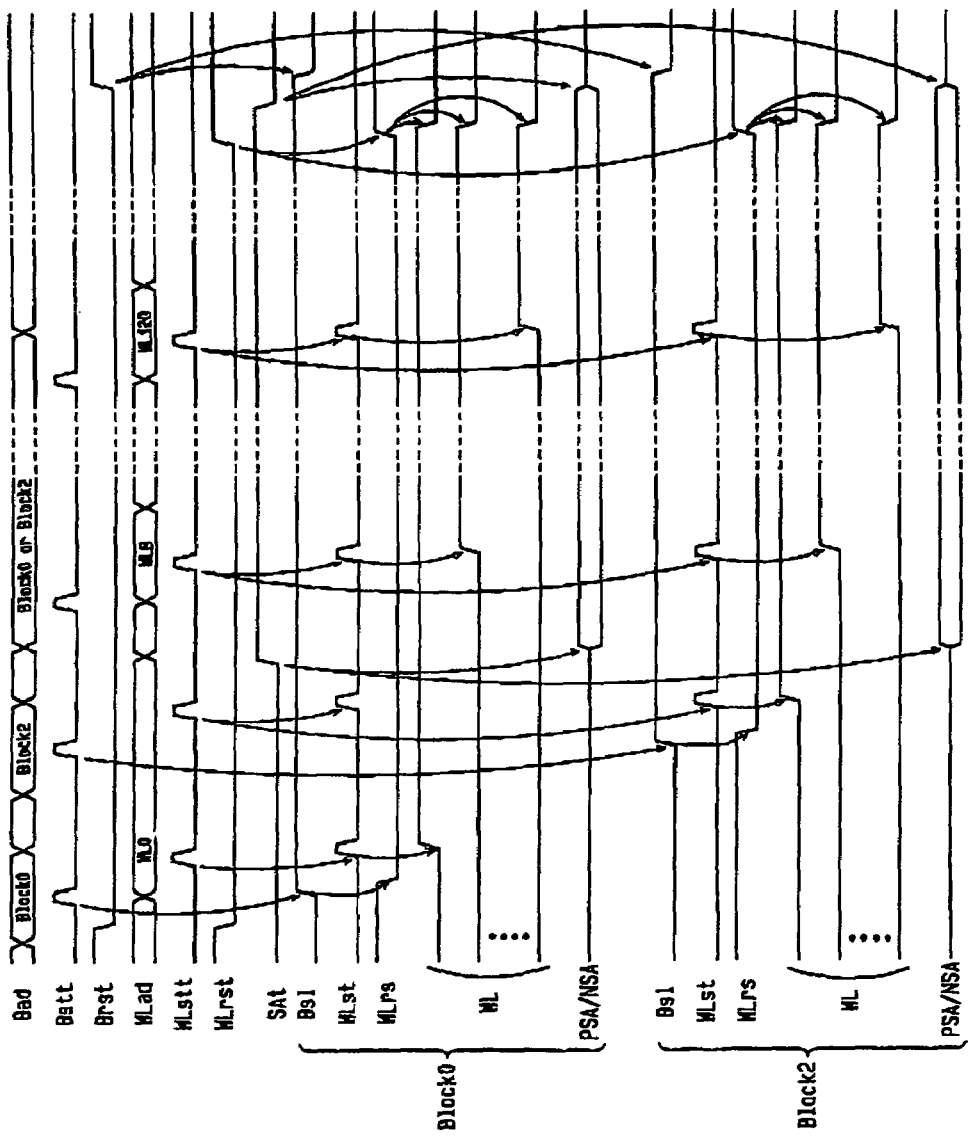
FIG. 7 is a combined timing and waveform chart illustrating the operation performed in the second test example of the semiconductor memory device of FIG. 1.

The configuration of the word line set signal generation circuit 25 is the same as that of the word line set signal generation circuit 10 in the prior art example of FIG. 3.

The word line reset signal generation circuit 26 includes a NAND circuit 14*d* in lieu of the inverter circuit 13*c* of the word line reset signal generation circuit 11 of FIG. 3. The NAND circuit 14*d* has a first input terminal, which is provided with the word line reset timing signal WLrst, and a second input terminal, which is provided with the block address signal Bad. The output signal of the NAND circuit 14*d* is provided to the second input terminal of the NAND circuit 14*b*. Accordingly, when the word line reset signal generation circuit 26 receives the word line reset timing signal WLrst at a high level and the block address signal Bad at a high level, the word line reset signal generation circuit 26 generates the word line reset signal WLrs at a high level.

Each sense amp drive circuit 22 includes NAND circuits 14*e*, 14*f*, 14*g*, 14*h* and an inverter circuit 13*h* in lieu of the NAND circuit 14*c* and the inverter circuit 13*e* of the sense amp drive circuit 3 of FIG. 3.

The NAND circuit 14*e* has a first input terminal, which receives the block selection signal Bs1, and a second input terminal, which receives a sense amp set timing signal SAstt from the timing signal generation circuit 5. The NAND circuit 14*f* has a first input terminal, which is provided with the word line reset signal WLrs, and a second input terminal, which is provided with a sense amp reset timing signal SArst from the timing signal generation circuit 5.

The output signal of the NAND circuit 14*e* is provided to a first input terminal of the NAND circuit 14*g*. The output signal of the NAND circuit 14*f* is provided to a first input terminal of the NAND circuit 14*h*. The output signal of the NAND circuit 14*g* is provided to a second input terminal of the NAND circuit 14*h*. The output signal of the NAND circuit 14*h* is provided to a second input terminal of the NAND circuit 14*g*. The NAND circuit 14*g*, 14*h* form a latch circuit.

The output signal of the NAND circuit 14*g* is provided to the gates of the transistors Tr1, Tr2, Tr3 via the inverter circuit 13*h*, and the output signal of the inverter circuit 13*h* is provided to the gate of the transistor Tr4 via the inverter circuit 13*f*. The transistors Tr1–Tr4 have the same configuration as those of the sense amp drive circuit 3.

When the NAND circuit 14*e* receives the block selection signal Bs1 at a high level and the sense amp set timing signal SAstt at a high level, the NAND circuit 14*e* generates a low output signal. The NAND circuit 14*g* provides the inverter circuit 13*h* with a high output signal. In this state, the transistors Tr1, Tr4 are activated and the transistors Tr2, Tr3 are inactivated. As a result, the sense amp drive circuit 22 provides the associated sense amps 8 with the sense amp drive signal PSA, the voltage of which is substantially the same as that of the power supply Vcc, and the sense amp drive signal NSA, the voltage of which is substantially the same as that of the power supply Vss.

When the NAND circuit 14*f* receives the word line reset signal WLrs at a high level and the sense amp reset timing signal SArst at a high level, the NAND circuit 14*f* generates a low output signal. Based on the low output signal of the NAND circuit 14*f*, the NAND circuit 14*h* outputs a high output signal.

In this state, the output signal of the NAND circuit 14*e* is high. Thus, the NAND circuit 14*g* generates a low output signal and provides the low output signal to the inverter circuit 13*h*. Accordingly, the high output signal of the inverter circuit 13*h* inactivates the transistors Tr1, Tr4 and activates the transistors Tr2, Tr3. As a result, the sense amp drive circuit 22 provides the associated sense amps 8 with the sense amp drive signals PSA, NSA, the voltage of which is the same as that of the precharge voltage Vp.

The configuration of each row decoder 23 is the same as that of the row decoder 2 of FIG. 3.

Figure 10:
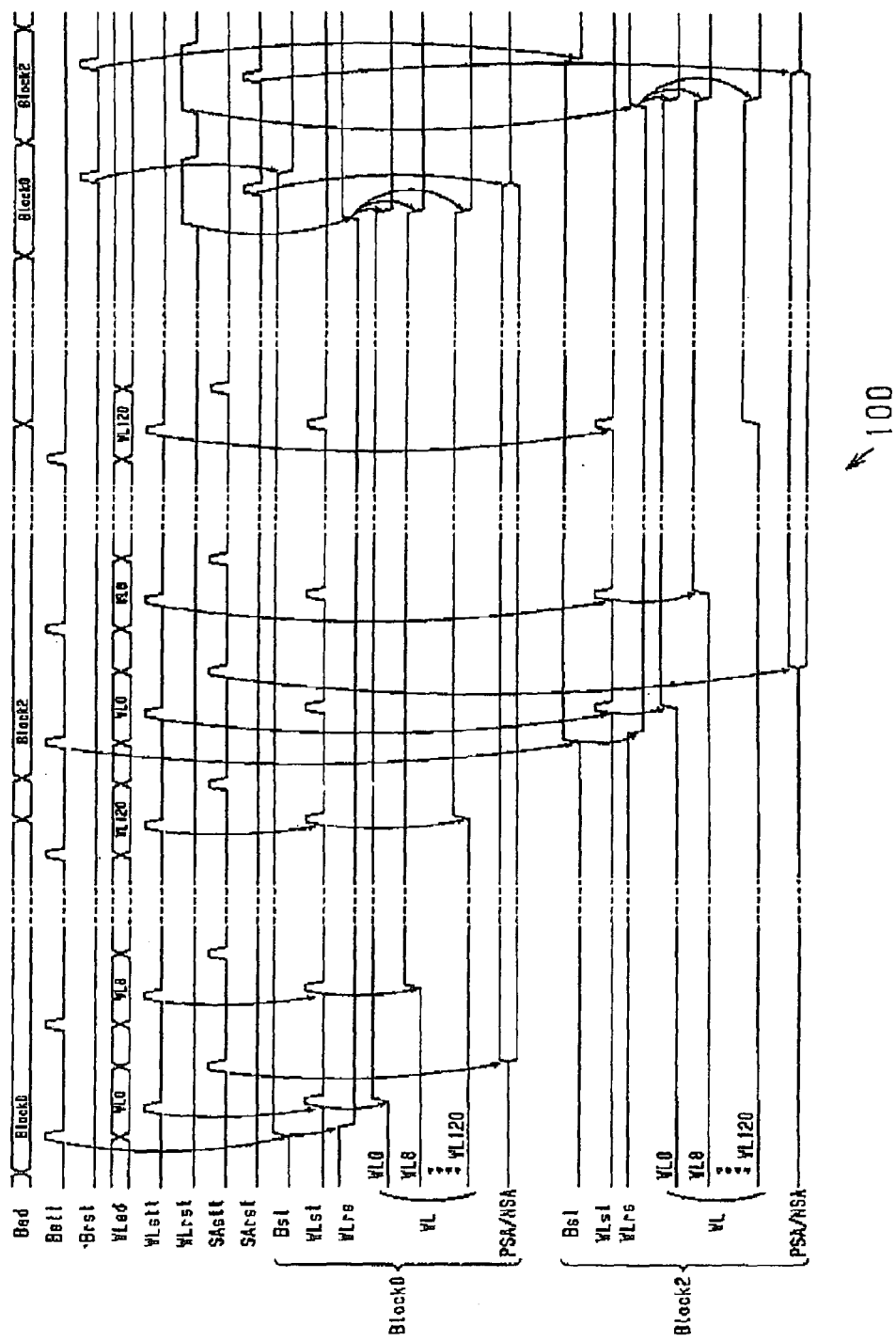
FIG. 10 is a combined timing and waveform chart illustrating the operation performed in the semiconductor memory device of FIG. 8.

The operation of the block control circuit 21, the sense amp drive circuit 22, and the row decoder 23 will now be discussed with reference to FIG. 10.

The block set timing signal Bstt and the block reset timing signal Brst provided from the timing signal generation circuit 5 to the block selection circuit 24 are pulse signals. When the block selection circuit 24 is provided with the block address signal Bad, which selects one of the blocks BL0–BL3 (block BL0 in FIG. 10), the block selection signal Bs1 goes high if the block set timing signal Bstt goes high.

When the block selection signal Bs1 goes high and the word line set signal generation circuit 25 receives the word line set timing signal WLstt, which is a pulse signal, the word line set signal generation circuit 25 generates the word line set signal WLst, which is a pulse signal.

The timing signal generation circuit 5 delays the word line set timing signal WLstt by a predetermined time to generate the sense amp set timing signal SAstt, which is a pulse signal, and provides the timing signal SAstt to each sense amp drive circuit 22. When the block selection signal Bs1 is high and the sense amp set timing signal SAstt goes high, the sense amp drive circuit 22 generates the sense amp drive signals PSA, NSA. The sense amp drive signals PSA, NSA are provided to the sense amps 8 in block SL0. This activates the sense amps 8. Such state is maintained.

When the word line address signal WLad is high and the word line set signal WLst goes high, the row decoder 2 increases the voltage of the corresponding word line WL. In block BL0, every eight word lines from word line WL0 are sequentially selected and the voltage of the selected word lines is increased.

The sense amps 8 in block BL0 are activated after a predetermined time from when the first word line WL0 is activated.

After completing the selection of every eight word lines in block BL0, the block address signal Bad shifts to select block BL2. In this state, when the block set timing signal Bstt goes high, the block selection signal Bs1 goes high in block BL2.

In this state, the word line set signal WLst goes high each time the word line set timing signal WLstt goes high. Every eight word lines are sequentially selected from word line WL0 based on the word line address signal WLad. The sense amp drive circuit 22 outputs the sense amp drive signals PSA, NSA and activates the sense amps 8 in block BL2. Such state is maintained.

When the selection of every eight lines in blocks BL0, BL2 is completed and after the selected state is maintained for a predetermined time, the semiconductor memory device 100 receives the block address signal Bad to select blocks BL0, BL2 based on the precharge command.

When the semiconductor memory device 100 is provided with the block address signal Bad of block BL0 and the word line reset timing signal WLrst goes high, the word line reset signal WLrs in block BL0 goes high. As the word line reset signal WLrs goes high, all of the selected word lines are inactivated.

When the sense amp reset timing signal SArst goes high, the sense amp drive circuit 22 of block BL0 stops outputting the sense amp drive signals PSA, NSA. This inactivates the sense amps 8.

Then, when the semiconductor memory device 100 is provided with the block address signal Bad and the word line reset timing signal WLrst goes high, the word line reset signal WLrs goes high in block BL2 and all of the selected word lines go low.

When the sense amp reset timing signal SArst goes high, block BL2 stops receiving the sense amp drive signals PSA, NSA. This inactivates the sense amps 8.

After the above operation, every eight word lines are sequentially selected from word line WL1 in blocks BL0, BL2 and the sense amps 8 are activated. This operation is repeated in the same manner. When the selection of all of the word lines is completed in blocks BL0, BL2, the same operation is repeated for blocks BL1, BL3.

Figure 11:
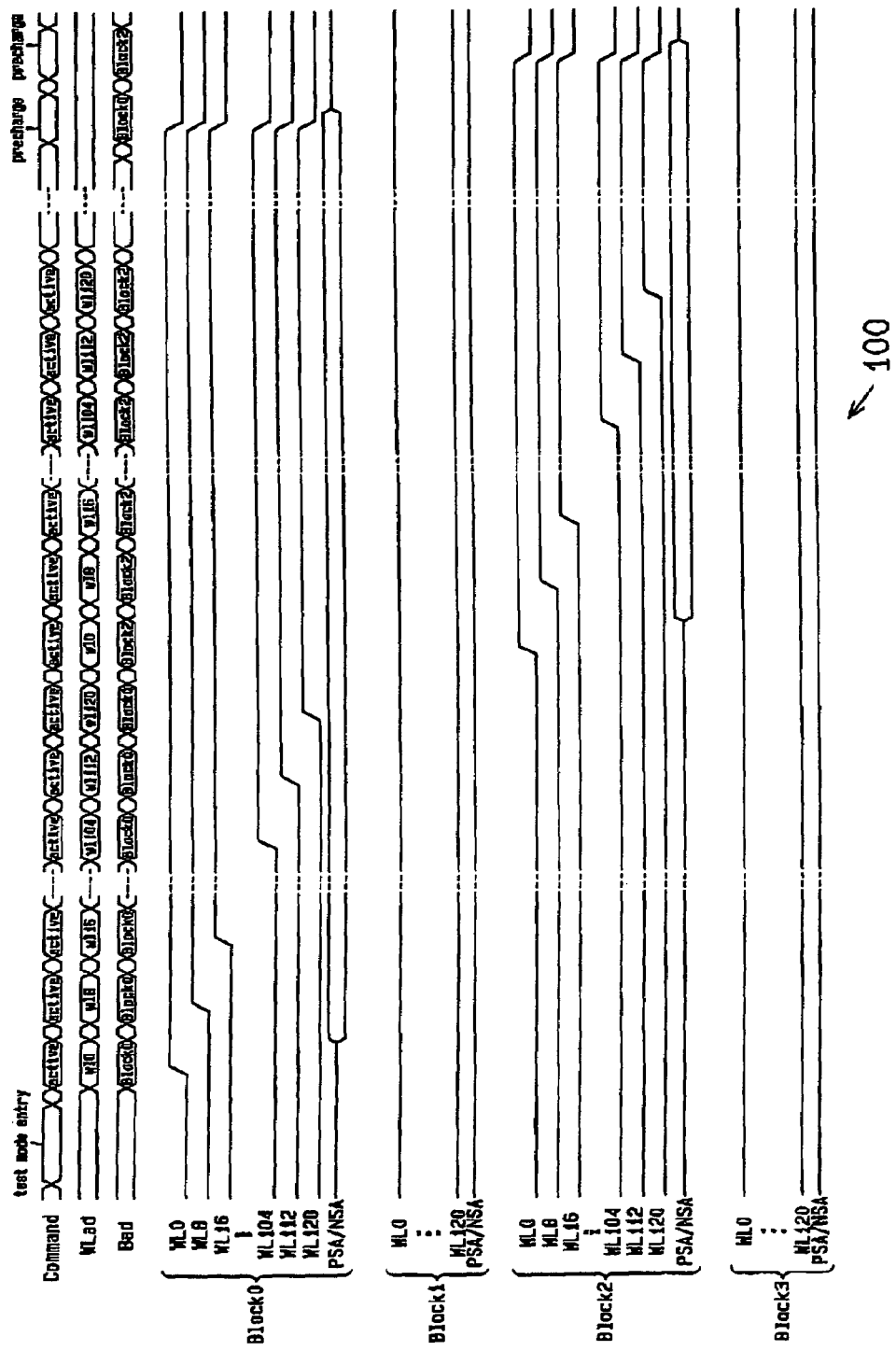
FIG. 11 is a combined timing and waveform chart illustrating the operation performed in the semiconductor memory device of FIG. 8.

FIG. 11 illustrates the selection of multiple word lines. An active command follows a test mode entry command. Based on the active command, every eight word lines are sequentially selected from word line WL0 based on the word line address WLad and the block address signal Bad.

The sense amps 8 of block BL0 are activated subsequent to the selection of word line WL0. When the selection of every eight word lines in block BL0 is completed, the semiconductor memory device 100 receives the block address signal Bad corresponding to block BL2. As a result, every eight word lines are selected in the same manner from word line WL0 in block BL2 and the associated sense amps 8 are activated.

Then, when the selection of every eight word lines from word line WL0 in blocks BL0, BL2 is completed, the semiconductor memory device 100 receives the block address signal Bad corresponding to blocks BL0, BL2 in synchronism with the precharge command.

Subsequently, based on the block address signal Bad corresponding to block BL0, the word lines selected in block BL0 are inactivated and the sense amps 8 associated with block BL0 are inactivated. Then, the word lines selected in block BL2 are inactivated, and the sense amps 8 associated with block BL2 are inactivated.

Such operation is repeated to select all of the word lines in blocks BL0, BL2. Afterward, the same operation is repeated in blocks BL1, BL3.

The semiconductor memory device 100 has the advantages described below.

(1) Multiple word lines of multiple blocks are simultaneously selected. This reduces the time required to conduct the multiple word line test.

(2) The activation timing and inactivation timing between the blocks are offset while simultaneously selecting multiple word lines of multiple blocks. This prevents noise from being produced when sense amps are activated or inactivated.

(3) The time from when a word line is selected to when a sense amp is activated is the same in each block. Thus, the margin for amplifying cell information is ensured for each block.

Second Embodiment

Figure 12:
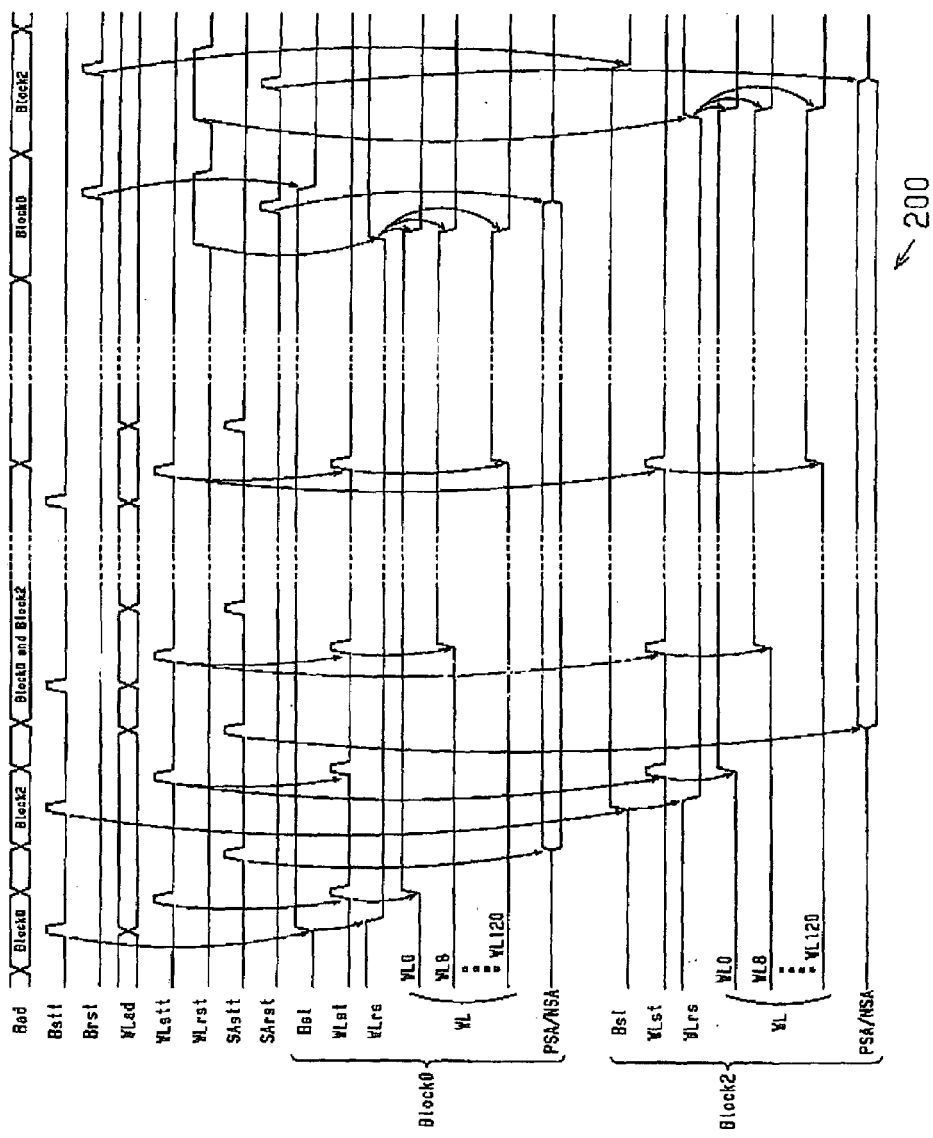
FIG. 12 is a combined timing and waveform chart illustrating the operation performed in a semiconductor memory device according to a second embodiment of the present invention.
Figure 13:
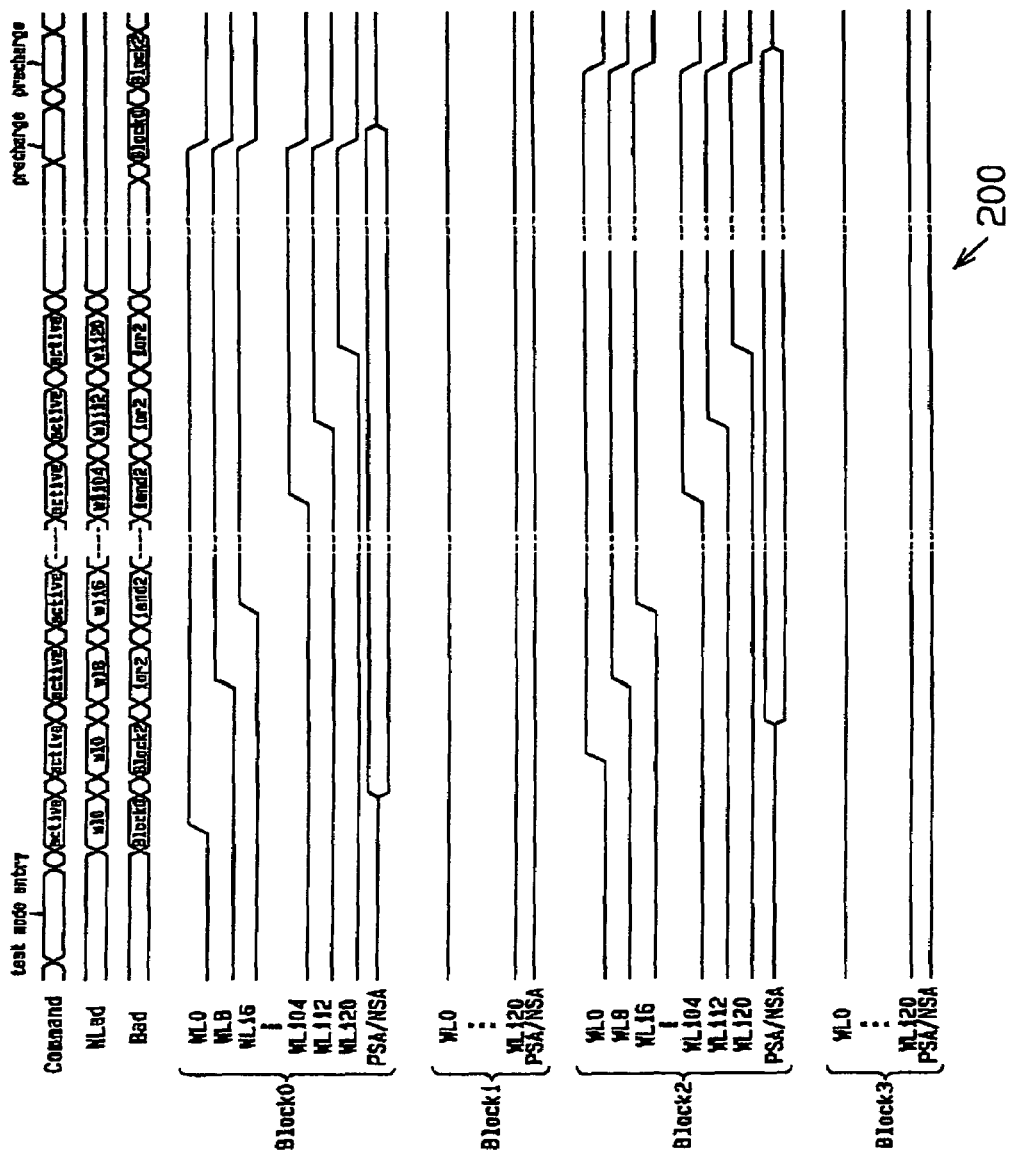
FIG. 13 is a combined timing and waveform chart illustrating the operation performed in a semiconductor memory device according to the second embodiment of the present invention.

FIGS. 12 and 13 illustrate the operational timing of a semiconductor memory device 200 according to a second embodiment of the present invention. The circuit configuration of the semiconductor memory device 200 of the second embodiment is the same as that of the semiconductor memory device 100 of the first embodiment.

The input timing of the block address signal Bad is changed in the semiconductor memory device 200 to simultaneously select word lines in multiple blocks, excluding the word lines that are selected first.

The operation of the block control circuit 21, the sense amp drive circuit 22, and the row decoder 23 will now be described with reference to FIG. 12.

In block BL0, when the block control circuit 21 is provided with the block address signal Bad, the block set timing signal Bstt is provided to the block control circuit 21. As a result, the block selection signal Bs1 goes high and the word line reset signal WLrs goes low.

Then, when the word line set timing signal WLstt goes high, the word line set signal WLst goes high. In this state, the word line WL0 goes high in block BL0.

Then, in block BL2, the block address signal Bad and the block set timing signal Bstt are provided to the block control circuit 21. As a result, the block selection signal Bs1 goes high, and the word line reset signal WLrs goes low.

Then, when the word line set timing signal WLstt goes high, the word line set signal WLst goes high. In this state, the word line WL0 goes high in block BL2.

Then, the word line address signal WLad is switched to correspond to the address corresponding to WL8. Then, when the word line set timing signal WLstt goes high, the word line set signal WLst goes high. In this state the word lines WL8 are simultaneously selected in blocks BL0, BL2.

Subsequently, every eight word lines are simultaneously selected in blocks BL0, BL2. When the selection of every eight word lines is completed, the word lines selected in block BL0 are simultaneously inactivated, and the sense amps 8 associated with block BL0 are inactivated.

Then, the word lines selected in block BL2 are simultaneously inactivated and the sense amps associated with block BL2 are inactivated. Afterward, the above operation is repeated in the same manner to select all of the word lines in blocks BL0, BL2. Subsequently, the above operation is performed in the same manner in blocks BL1, BL3.

The semiconductor memory device 200 has the advantages described below.

Except for the word lines that are first selected, word lines of the same address are selected at the same timing in multiple blocks. Thus, the time for conducting the multiple word line selection test is further reduced.

It should be apparent to those skilled in the art that the present invention may be embodied in many other specific forms without departing from the spirit or scope of the invention. Particularly, it should be understood that the present invention may be embodied in the following forms.

Figure 14:
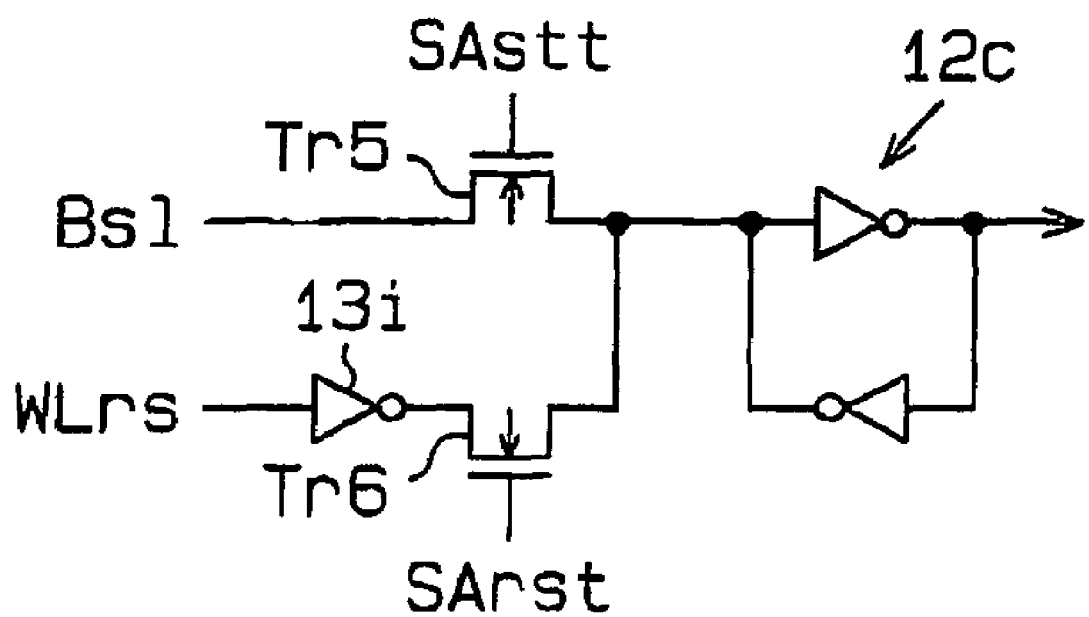
FIG. 14 is a circuit diagram showing a further example of a sense amp drive circuit.

The NAND circuits 14e–14h and the inverter circuit 13h included in the sense amp drive circuit 22 of FIG. 9 may be replaced by the circuit shown in FIG. 14. The circuit of FIG. 14 includes n-channel MOS transistors Tr5, Tr6, an inverter circuit 13i, and a latch circuit 12c. The output signal of the latch circuit 12c is provided to the transistors Tr1–Tr3 and the inverter circuit 13f of the sense amp drive circuit 22 shown in FIG. 9.

In this case, when the sense amps are activated, the sense amp set timing signal SAstt goes high when the block selection signal Bs1 goes high. This causes the output signal of the latch circuit 12c to go low and activates the sense amp 8.

The sense amp reset timing signal SArst goes high when the word line reset signal WLrs is high. This causes the output signal of the latch circuit 12c to go high and inactivates the sense amp 8.

In the above embodiment, every eight word lines are selected in each block. However, the interval between selected word lines does not have to be eight and may be any other number.

The number of blocks does not have to be four. Any other number of blocks may be used. Further, the number of simultaneously selected blocks is not limited to two.

The present examples and embodiments are to be considered as illustrative and not restrictive, and the invention is not to be limited to the details given herein, but may be modified within the scope and equivalence of the appended claims.

What is claimed is:

1. A method for conducting a multiple word line selection test on a semiconductor memory device provided with a plurality of memory cell blocks, which include a first memory cell block and a second memory cell block, each of the memory cell blocks having a plurality of memory cells and a plurality of word lines connected to the memory cells, and a plurality of sense amp groups connected to the first and second memory cell blocks, each of the sense amp groups amplifying cell information read from the plurality of memory cells of an associated one of the memory cell blocks, and a plurality of block control circuits respectively connected to the plurality of memory cell blocks, which include a first block control circuit and a second block control circuit, wherein when the multiple word line selection test is conducted, the plurality of word lines and the sense amp group in each of the plurality of memory cell blocks are activated, the method comprising:
a first step for generating a first reset signal using the first block control circuit;
a second step for inactivating multiple word lines in the first memory cell block and the sense amp group associated with the first memory cell block in response to the first reset signal; and
a third step for generating a second reset signal using the second block control circuit;
a fourth step for inactivating multiple word lines in the second memory cell block and the sense amp group associated with the second memory cell block after performing the first step in response to the second reset signal.

2. A method for conducting a multiple word line selection test on a semiconductor memory device provided with a plurality of memory cell blocks, which include a first memory cell block and a second memory cell block, each of the memory cell blocks having a plurality of memory cells and a plurality of word lines connected to the memory cells, and a plurality of sense amp groups connected to the first and second memory cell blocks, each of the sense amp groups amplifying cell information read from the plurality of memory cells of an associated one of the memory cell blocks, the method comprising:
a first step for activating one of the plurality of word lines in the first memory cell block and activating the sense amp group associated with the first memory cell block after a predetermined time;
a second step for activating word lines other than the one that has been activated in the first memory cell block;
a third step for activating one of the plurality of word lines in the second memory cell block and activating the sense amp group associated with the second memory cell block after a predetermined time;
a fourth step for activating word lines other than the one that has been activated in the second memory cell block;
a fifth step for inactivating multiple word lines in the first memory cell block and the sense amp group associated with the first memory cell block; and
a sixth step for inactivating multiple word lines in the second memory block and the sense amp group associated with the second memory block after performing the fifth step;
wherein the third and fourth steps are performed while the first and second steps are continuously performed or the second and fourth steps are performed while the first and third steps are continuously performed.

3. A semiconductor memory device comprising:
a plurality of memory cell blocks, wherein each of the memory cell blocks includes a plurality of memory cells and a plurality of word lines connected to the memory cells;
a plurality of row decoders connected to the plurality of memory cell blocks, wherein each of the row decoders selects one of the word lines in an associated one of the memory cell blocks;
a plurality of sense amp groups connected to the plurality of memory cell blocks, wherein each of the sense amp groups amplifies cell information read from the plurality of memory cells of an associated one of the memory cell blocks;
a plurality of block control circuits connected to the plurality of row decoders, wherein each of the block control circuits simultaneously selects multiple word lines in an associated one of the memory cell blocks and generates a sense amp control signal and a word line reset signal; and a plurality of sense amp drive circuits connected to the plurality of block control circuits and the plurality of sense amp groups, wherein each of the sense amp drive circuits selectively activates an associated one of the sense amp groups based on the sense amp control signal of the associated one of the block control circuits, each of the sense amp drive circuits including a latch circuit that is reset by the word line reset signal and a sense amp reset timing signal.

4. The device according to claim 3, further comprising:

a timing signal generation circuit connected to the plurality of sense amp drive circuits for generating a sense amp set timing signal, which selectively controls activation of the plurality of sense amp groups, and a sense amp reset timing signal;

wherein the latch circuit receives the sense amp set timing signal and the sense amp reset timing signal.

5. The device according to claim 3, wherein the block control circuit includes a word line reset signal generation circuit for generating a word line reset signal that stops selecting the plurality of word lines, wherein the latch circuit receives the word line reset signal including block information.

* * * * *